(12) United States Patent
Park et al.

(10) Patent No.: US 7,612,361 B2
(45) Date of Patent: Nov. 3, 2009

(54) METHOD OF GROWING A NITRIDE SINGLE CRYSTAL ON SILICON WAFER, NITRIDE SEMICONDUCTOR LIGHT EMITTING DIODE MANUFACTURED USING THE SAME AND THE MANUFACTURING METHOD

(75) Inventors: Hee Seok Park, Gyunggi-do (KR); Zhilyaev Yuri Vasilievich, St.-Petersburg (RU); Bessolov Vasiliy Nikolaevich, St.-Petersburg (RU)

(73) Assignees: Samsung Electro-Mechanics Co., Ltd., Gyunggi-Do (KR); Ioffe Physico-Technical Institute RAS, Saint Petersburg (RU)

( * ) Notice: Subject to any disclaimer, the term of this patent is extended or adjusted under 35 U.S.C. 154(b) by 96 days.

(21) Appl. No.: 11/826,874

(22) Filed: Jul. 19, 2007

(65) Prior Publication Data
US 2008/0023710 A1    Jan. 31, 2008

(30) Foreign Application Priority Data
Jul. 25, 2006   (RU) .............................. 2006127075

(51) Int. Cl.
H01L 33/00    (2006.01)
H01L 21/20    (2006.01)

(52) U.S. Cl. ............................ 257/13; 257/94; 257/190; 257/E33.023; 438/47
(58) Field of Classification Search .................. 257/13; 438/22, 46, 47, 13, 94, 190, E33.004, E33.023, 438/E33.034
See application file for complete search history.

(56) References Cited

U.S. PATENT DOCUMENTS

| | | | |
|---|---|---|---|
| 7,071,015 B2 * | 7/2006 | Shakuda | 438/46 |
| 2001/0038656 A1 * | 11/2001 | Takeuchi et al. | 372/45 |
| 2005/0139818 A1 * | 6/2005 | Lee et al. | 257/14 |

* cited by examiner

Primary Examiner—Sue Purvis
Assistant Examiner—Scott Stowe
(74) Attorney, Agent, or Firm—McDermott Will & Emery LLP

(57) ABSTRACT

The invention provides a method for growing a nitride single crystal on a silicon wafer and a method for manufacturing a light emitting device using the same. In growing the nitride single crystal according to one aspect of the invention, first, a silicon substrate having a surface in (111) crystal orientation is prepared. A first nitride buffer layer is formed on the surface of the silicon substrate. Then, an amorphous oxide film is disposed on the first nitride buffer layer. A second buffer layer is disposed on the amorphous oxide film. Thereafter, the nitride single crystal is formed on the second nitride buffer layer.

20 Claims, 7 Drawing Sheets

METHOD OF GROWING A NITRIDE SINGLE CRYSTAL ON SILICON WAFER, NITRIDE SEMICONDUCTOR LIGHT EMITTING DIODE MANUFACTURED USING THE SAME AND THE MANUFACTURING METHOD

BACKGROUND OF THE INVENTION

1. Field of the Invention

The present invention relates to a method for growing a nitride single crystal. More particularly, the present invention relates to a method for growing a high-quality nitride single crystal on a silicon substrate, a nitride semiconductor light emitting device using the same and a manufacturing method thereof.

2. Description of the Related Art

A nitride semiconductor light emitting device has been hugely spotlighted in related technological fields as a high-power optical device that ensures full-color emission from light of short wavelengths such as blue or green light. In general, the nitride semiconductor light emitting device is made of a nitride single crystal having a composition expressed by $Al_xIn_yGa_{(1-x-y)}N$, where $0 \leq x \leq 1$, $0 \leq y \leq 1$ and $0 \leq x+y \leq 1$.

To manufacture the nitride semiconductor light emitting device essentially requires a technique for growing a high-quality nitride single crystal. However, a substrate material for growing a nitride single crystal thereon, which matches lattice constant and thermal expansion coefficient with the nitride single crystal, has not been commonly available Chiefly, the nitride single crystal is grown on a hetero-substrate such as a sapphire substrate ($\alpha$-$Al_2O_3$) or a SiC substrate via a Vapor Phase Growth method such as Metal Organic Chemical Vapor Deposition (MOCVD) or Hydride Vapor Phase Epitaxy (HVPE), or a Molecular Beam Epitaxy method (MBE).

However, due to expensiveness and size limited to 2 or 3 inches, disadvantageously, the single crystal sapphire substrate or SiC substrate is inappropriate for mass-production.

Therefore, in the art, a Si substrate which is in common use in the semiconductor industry needs to be adopted. But, owing to differences in lattice constant and thermal expansion coefficient between the Si substrate and a GaN single crystal, a GaN layer suffers too many defects and cracks to be commercialized.

According to a conventional method to overcome this problem, a buffer layer may be formed on the Si substrate, which however is not considered a suitable solution. FIG. 1(a) illustrates a GaN single crystal grown on an AlN buffer layer according to the prior art, and FIG. 1(b) illustrates another GaN single crystal grown on a buffer structure having the AlN buffer layer combined with an AlGaN intermediate layer.

As shown in FIG. 1(a), a GaN single crystal 15 is grown to a thickness of 2 μm on a conventional AlN buffer layer 12 formed on (111) crystal plane of a Si substrate 11. FIG. 2(a) is an optical microscope picture illustrating a surface of the grown GaN single crystal 15 as shown in FIG. 1(a). FIG. 2(a) confirms a number of cracks generated. The cracks occur owing to differences in lattice constant and thermal expansion coefficient which are rarely reduced or narrowed. This disadvantageously degrades capability and lifetime of the device, rendering it almost uncommercializable.

Referring to FIG. 1(b), a semiconductor structure is shown having an AlN buffer layer 23 formed on (111) crystal plane of a Si substrate 21, an $Al_xGa_{1-x}N$ intermediate layer 23 grown to a total thickness of 300 nm, with its Al composition ratio (x) varied in a range of about 0.87 to 0.07, and a GaN single crystal 25 is grown on the $Al_xGa_{1-x}N$ intermediate layer 23 to a thickness of 2 μm. FIG. 2(b) is an optical microscopic picture illustrating a surface of the GaN single crystal 25 grown in FIG. 1(b). FIG. 2(b) confirms still a great number of, even if reduced from FIG. 2(a), cracks generated. The buffer structure suggested in FIG. 1(b) is not suitable for growing a high-quality single crystal.

Therefore, in the art, there has been a demand for a method for growing a high-quality crack-free nitride crystal layer on a Si substrate and a nitride semiconductor light emitting device using the same.

SUMMARY OF THE INVENTION

The present invention has been made to solve the foregoing problems of the prior art and it is therefore an object of the present invention to provide a method for growing a nitride single crystal via a novel buffer structure to grow a high-quality nitride single crystal on a silicon (Si) substrate.

It is another object of the invention to provide a nitride light emitting device grown on a novel buffer layer which is formed on the silicon substrate, and a manufacturing method thereof.

According to an aspect of the invention for realizing the object, there is provided a method for growing a nitride single crystal comprising steps of:

preparing a silicon substrate having a surface in (111) crystal orientation;

forming a first nitride buffer layer on the surface of the silicon substrate;

forming an amorphous oxide film on the first nitride buffer layer;

forming a second nitride buffer layer on the amorphous oxide film; and forming the nitride single crystal on the second nitride buffer layer.

The amorphous oxide film is an $Al_2O_3$ amorphous film.

Preferably, the amorphous oxide film has a thickness of about 5 nm to 30 nm.

The first and second nitride buffer layer has a composition expressed by $Al_xIn_yGa_{(1-x-y)}N$, where $0 \leq x \leq 1$, $0 \leq y \leq 1$ and $0 \leq x+y \leq 1$. More specifically, at least one of the first and second buffer layers have an identical composition.

Preferably, the first nitride buffer layer has a thickness of at least 10 nm. The second nitride buffer layer has a thickness of about 30 nm to 200 nm.

Preferably, the nitride single crystal forming step is carried out via HVPE.

According to another aspect of the invention for realizing the object, there is provided a nitride semiconductor light emitting device comprising: a silicon substrate having a surface in (111) crystal orientation; a first nitride buffer layer formed on the surface of the silicon substrate; an amorphous oxide film formed on the first nitride buffer layer; a second nitride buffer layer formed on the amorphous oxide film; a first conductivity-type nitride semiconductor layer formed on the second nitride buffer layer; an active layer formed on the first conductivity-type nitride semiconductor layer; and a second conductivity-type nitride semiconductor layer formed on the active layer.

Preferably, to ensure electrical transmissivity in a vertical direction, the amorphous oxide film is patterned such that the first buffer layer directly contacts the second nitride buffer layer in a partial area of the amorphous oxide film.

According to further another aspect of the invention for realizing the object, there is provided a method for manufacturing a nitride semiconductor light emitting device comprising steps of:

preparing a silicon substrate having a surface in (111) crystal orientation;

forming a first nitride buffer layer on the surface of the silicon substrate;

forming an amorphous oxide film on the first nitride buffer layer;

forming a second nitride buffer layer on the amorphous oxide film;

forming a first conductivity-type nitride semiconductor layer on the second nitride buffer layer;

forming an active layer on the first conductivity-type nitride semiconductor layer; and forming a second conductivity-type nitride semiconductor layer on the active layer.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1A:
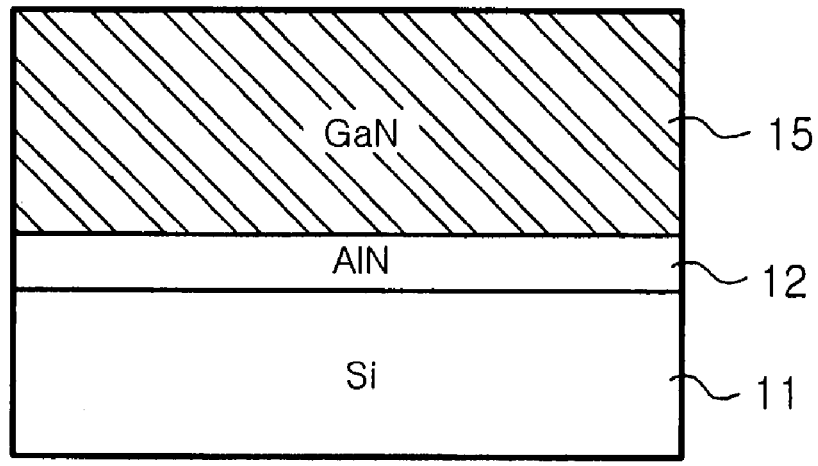
FIGS. 1(a) and (b) illustrate nitride single crystal structures grown on a silicon substrate according to the prior art.
Figure 1B:
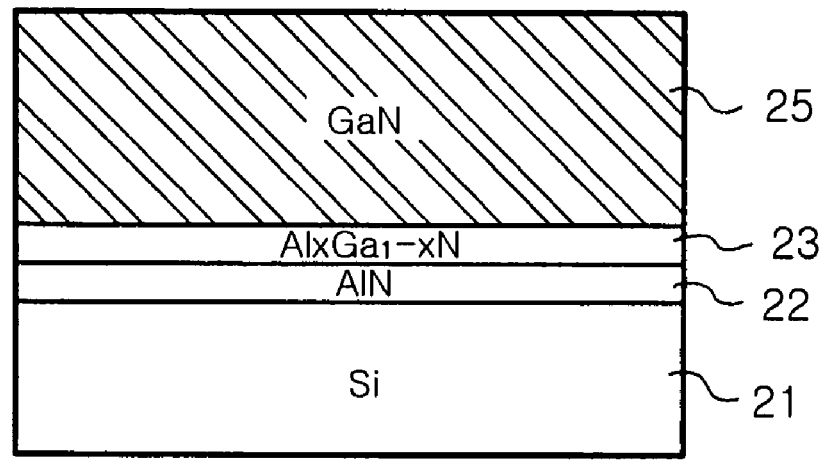
Figure 2A:
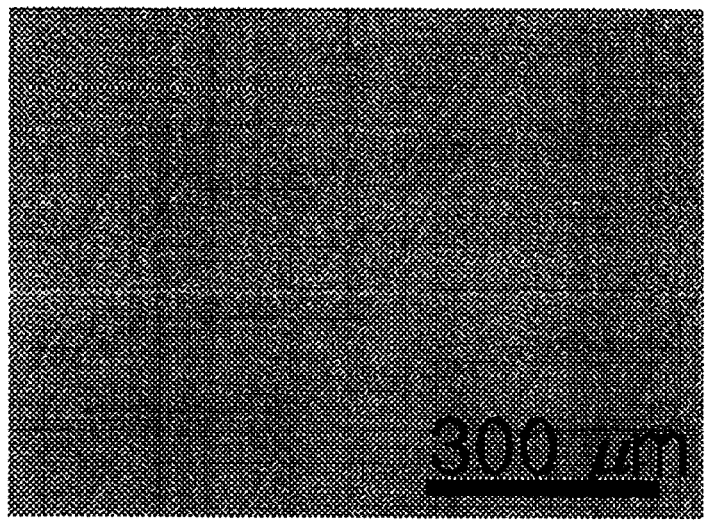
FIGS. 2(a) and (b) are optical microscopic pictures illustrating a surface of a nitride single crystal shown in FIGS. 1(a) and (b).
Figure 2B:
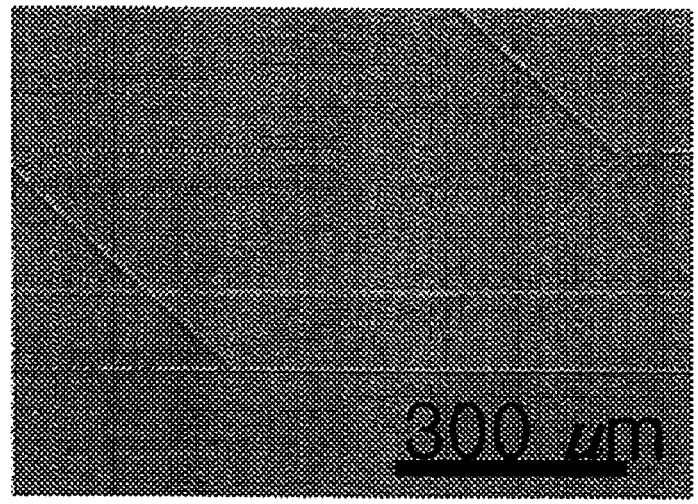
Figure 3A:
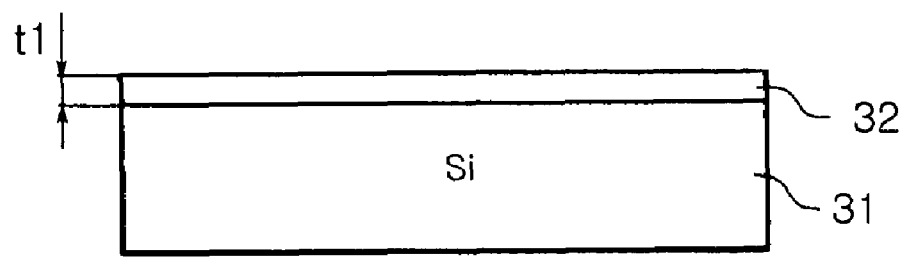
FIGS. 3(a) to (c) are cross-sectional views illustrating in a stepwise fashion a method for growing a nitride single crystal according to one aspect of the invention.
Figure 3B:
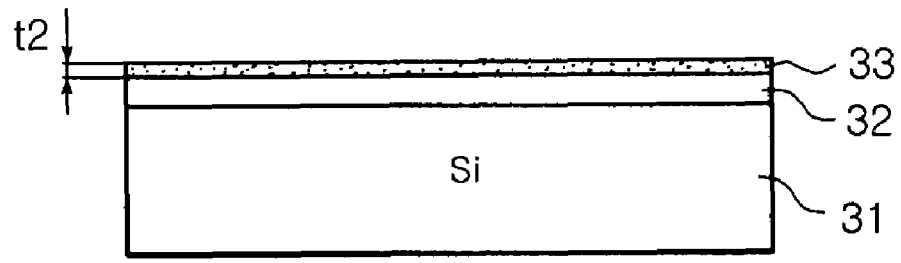
Figure 3C:
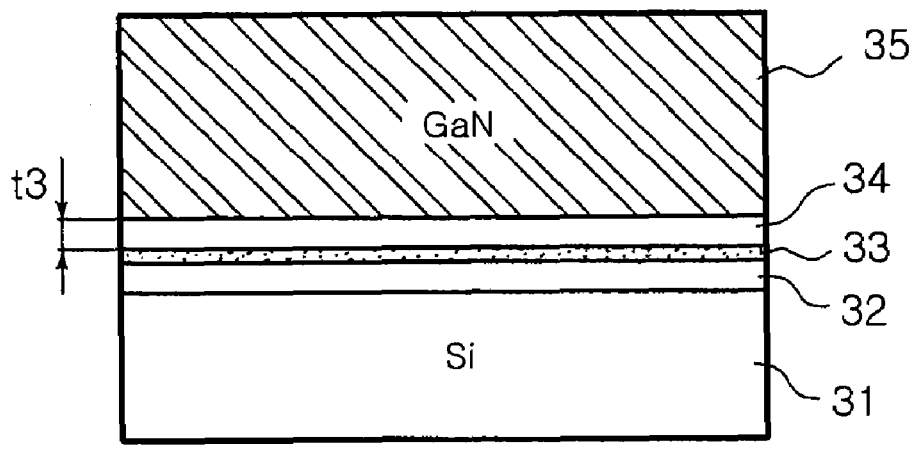

FIGS. 3(a) to 3(c) are cross-sectional views for explaining in a stepwise fashion a method for growing a nitride single crystal according to one aspect of the invention.

As shown in FIG. 3 (a), a first nitride buffer layer 32 is formed on a silicon substrate 31. The silicon substrate 31 has an upper surface in (111) crystal orientation. The first nitride buffer layer 32 may have a composition expressed by $Al_x In_y Ga_{(1-x-y)}N$, where $0 \leq x \leq 1$, $0 \leq y \leq 1$ and $0 \leq x+y \leq 1$. Preferably, the first nitride buffer layer 32 is exemplified by AlN, which advantageously prevents reaction of Si element and Ga element of the silicon substrate 31 and relieves stress triggered by lattice mismatch. The first nitride buffer layer 32 apparently has a thickness t1 of a general buffer layer, preferably at least 10 nm. It is of little meaning to set a specific upper limit but preferably, the first nitride buffer layer 32 has a thickness 51 of 500 mn or less to ensure efficiency of a process. The process is a well-known nitride growth process such as MOCVD, MBE or HVPE, or an RF sputtering process may be employed. The first nitride buffer layer 32 suffers many defects due to lattice mismatch, thus exhibiting high dislocation density.

Then, as shown in FIG. 3(b), an amorphous oxide film 33 is formed on the first nitride buffer layer 32. Due to a considerable thinness, the amorphous oxide film 33 does not function as an amorphous insulating film but blocks dislocation of the first nitride buffer layer 32, ensuring conditions suitable for growing a higher-quality crystal thereon. Such an amorphous oxide film 33 may be an $Al_2O_3$ amorphous film. The amorphous oxide film 33 employed in the invention enables conditions for a second nitride buffer layer (34 in FIG. 3(c)) to be formed later to a critical nucleation size bigger than that of the first buffer layer 32. The amorphous oxide film 33 has a thickness t2 of about 5 nm to 300 nm. The depth less than 5 nm renders it difficult to block crystal information (e.g., crystal defects) of a underlying layer 31, while the depth in excess of 30 nm prevents the amorphous oxide film 33 from serving as a high-quality crystal growth surface owing to the intrinsic properties thereof.

Next, as shown in FIG. 3c, a second nitride buffer layer 34 is formed on the amorphous oxide film 33 and a nitride single crystal 35 is formed on the second nitride buffer layer 34. The second nitride buffer layer 34, as stated earlier, can be grown such that it exhibits dislocation density lower than that of the first nitride buffer layer 32 due to the amorphous oxide film 33. Preferably, the second nitride buffer layer 34 has a thickness of about 30 to 200 nm. The depth less than 30 nm renders it difficult to serve as a buffer layer having superior crystal information, while the depth in excess of 200 nm potentially increases dislocation defects generated during a growth process of the second nitride buffer layer 34. For the second nitride buffer 34, AlN may be used. Preferably, the first and second nitride buffer layers 32 and 34 have an identical composition. In this case, the amorphous oxide film 33 can be formed via just a process of converting an atmospheric gas into an $O_2$ gas during quite a short period at an appropriate point of time in the process of forming the nitride buffer layer. In addition, the nitride growth process may be conducted substantially continuously to obtain a desired buffer layer.

Further, preferably, a nitride single crystal 35 is formed on the second nitride buffer layer 34 via Hydride Vapor Phase Epitaxy (HVPE), which enables growth of the film at higher speed than MOCVD.

Figure 4:
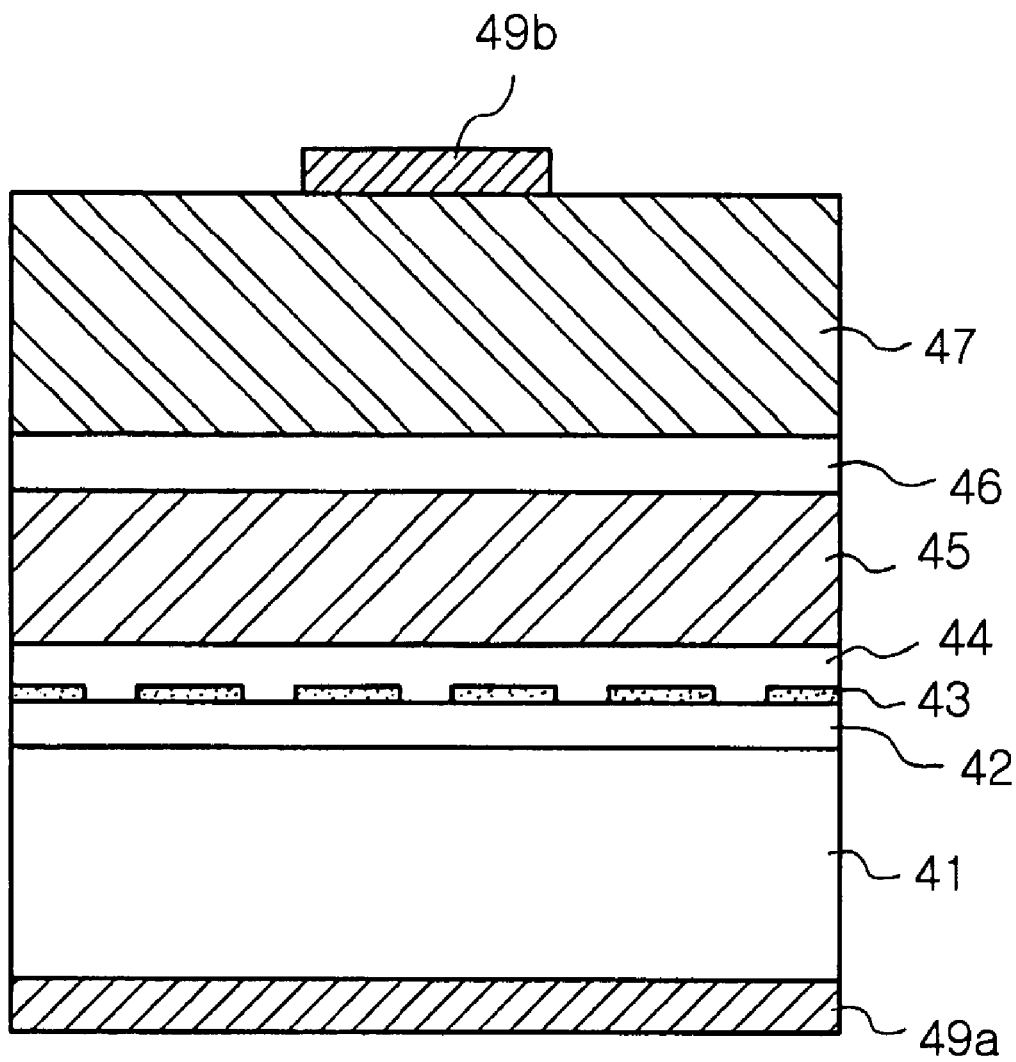
FIG. 4 is a vertical cross-sectional view illustrating a nitride semiconductor light emitting device manufactured according to another aspect of the invention.

FIG. 4 is a vertical cross-sectional view illustrating a nitride semiconductor light emitting device according to another aspect of the invention.

Referring to FIG. 4, the nitride semiconductor light emitting device 40 of the invention includes a novel buffer structure formed on a silicon substrate. The buffer structure, in a similar manner to the buffer layer of FIG. 3, includes a first nitride buffer layer 42, a second nitride buffer layer 44 and an amorphous oxide film 43 interposed therebetween. A first conductivity-type semiconductor layer 45, an active layer 46 and a second conductivity-type semiconductor layer 47 are formed sequentially on the second nitride buffer layer 44, thereby forming a nitride light emitting structure. Also, a first electrode 49a is formed on an underside of the silicon substrate 41 and a second electrode 49b is formed on a top surface of the second conductivity-type semiconductor layer 47.

The buffer layer employed in the embodiment is apparently similar to that of FIG. 3 and descriptions about the thickness and growth conditions can be applied in a similar fashion in forming the light emitting device. However, the amorphous oxide film 43 is patterned with opened partial areas such that the first and second nitride buffer layers 42 and 44 are connected each other. Such pattern of the amorphous oxide film 43 ensures an electrical transmissivity route between the silicon substrate 41 and nitride light emitting structure including the semiconductor and active layers 45, 46 and 47. Consequently, even though the insulating amorphous oxide film 43 is employed to form the second nitride buffer layer 44 having lower dislocation density, a vertical nitride light emitting structure having electrodes disposed on vertically opposed faces can be realized.

Further, to boost current spread efficiency, the insulating amorphous oxide film 43 may be stripe- or mesh-patterned at uniform intervals across the total area as in FIG. 4.

A method for growing a nitride single crystal of the invention will be explained hereunder with reference to the following detailed embodiment.

EXAMPLE

First, a silicon substrate was placed in a HVPE reactor. Then an AlCl gas and an $NH_3$ gas were supplied at a temperature of 900° C. to grow a first AlN buffer layer to a thickness of about 300 nm. Thereafter, the $NH_3$ gas was substituted by an $O_2$ gas to grow an amorphous oxide to a thickness of about 20 nm. The $O_2$ gas was substituted by the $NH_3$ again to grow a second AlN buffer layer to a thickness of about 100 nm. Finally, a GaCl gas and the $NH_3$ gas were supplied to grow a GaN layer.

Figures 5A, 5B:
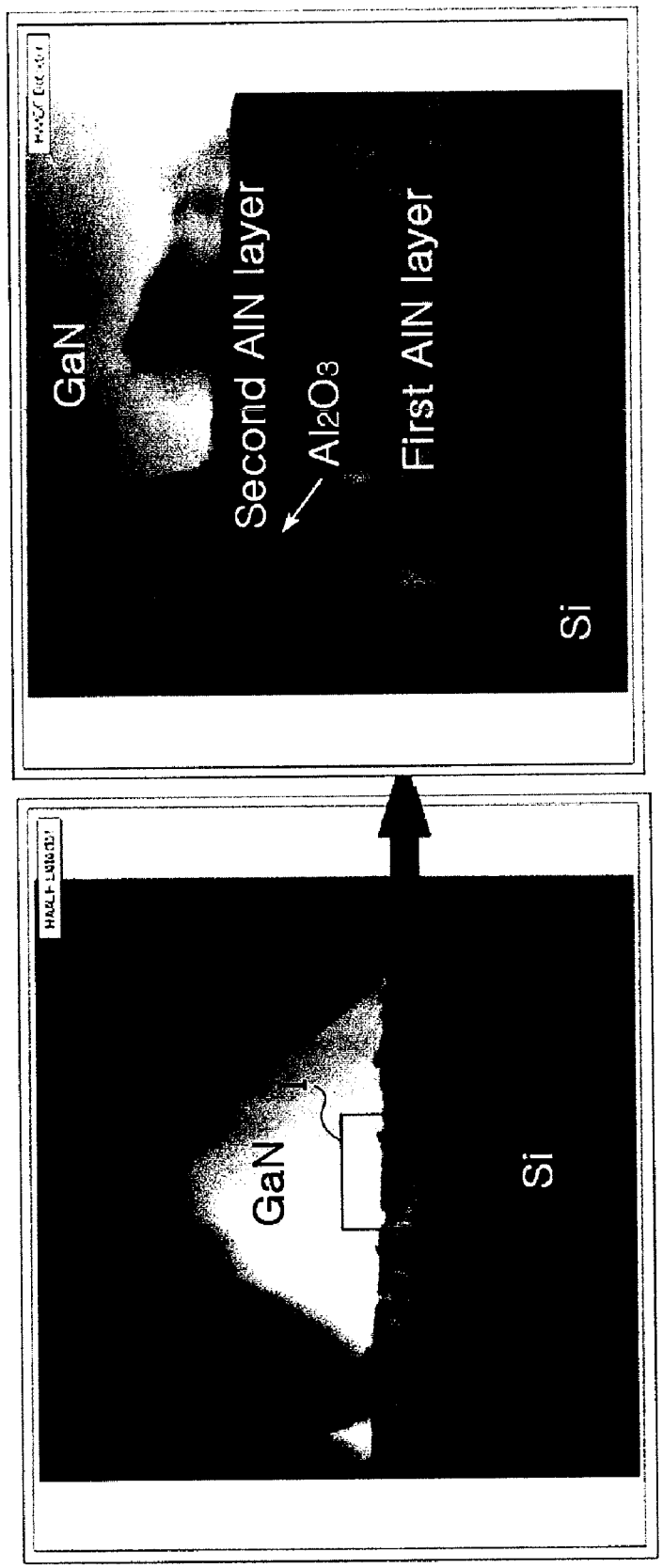
FIGS. 5(a) to (b) are TEM pictures illustrating a GaN layer formed on a silicon substrate and a buffer structure according to one embodiment of the invention.

FIGS. 5(a) and (b) are Transmission Electron Microscope (TEM) pictures illustrating the GaN layer grown on the silicon substrate and the buffer structure according to the embodiment of the invention. As confirmed in FIG. 5(b) which illustrates a magnification of the buffer layer of FIG. 5(a), a very thin $Al_2O_3$ was formed between the first and second AlN buffer layers.

Figure 6:
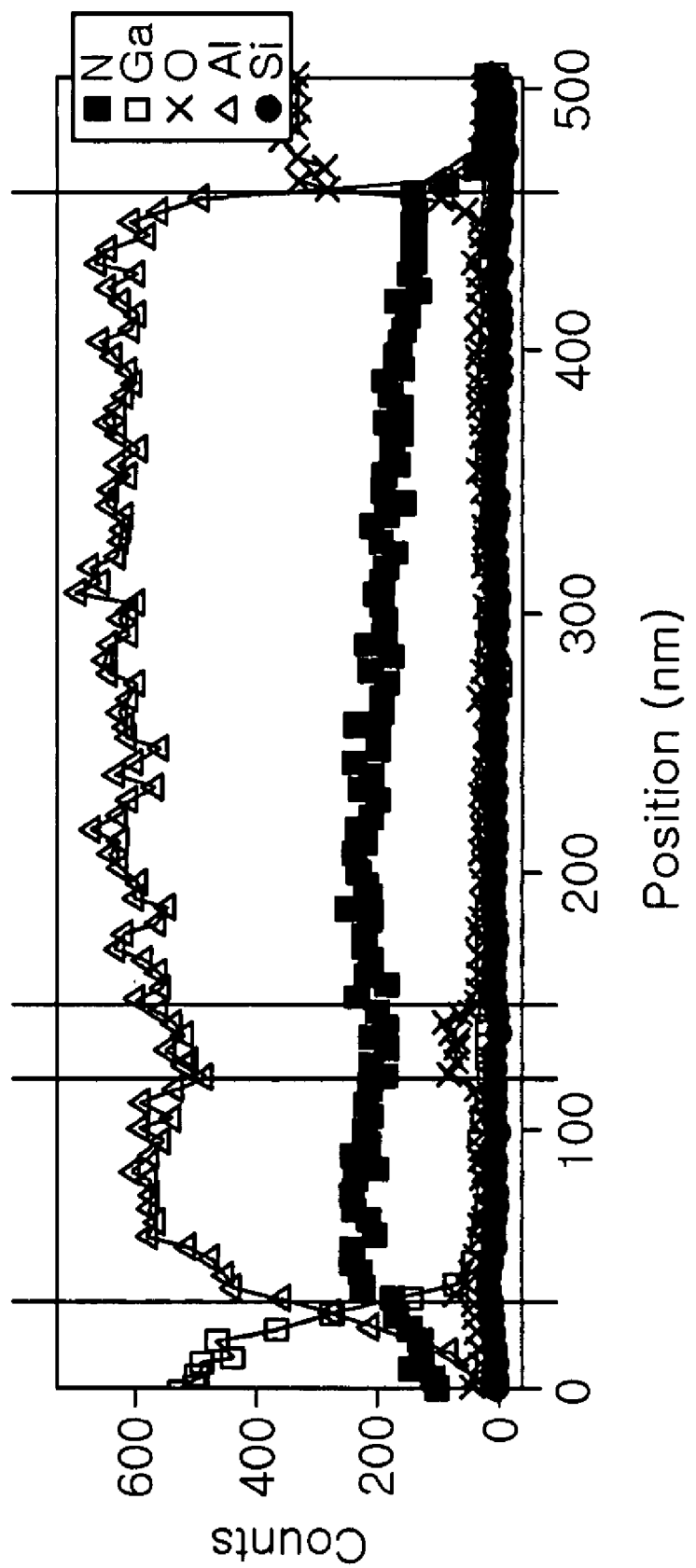
FIG. 6 is a graph illustrating an EDS composition analysis result for the buffer structure employed in one embodiment of the invention.

Also, compositions from the GaN layer to the silicon substrate were analyzed via Electrostatic Discharge (ESD) test, and FIG. 6 illustrates a graph for the results.

A first AlN buffer layer B was grown on the silicon substrate A to a thickness of about 300 nm, and an oxide film C was grown thereon to a thickness of about 20 nm. Also, a second AlN buffer layer D was grown on the oxide film C to a thickness of about 100 nm. Then, a GaN single crystal E was grown on the second AlN buffer layer D. The oxide film C employed in the embodiment of the invention was an amorphous $Al_2O_3$.

Figure 7A:
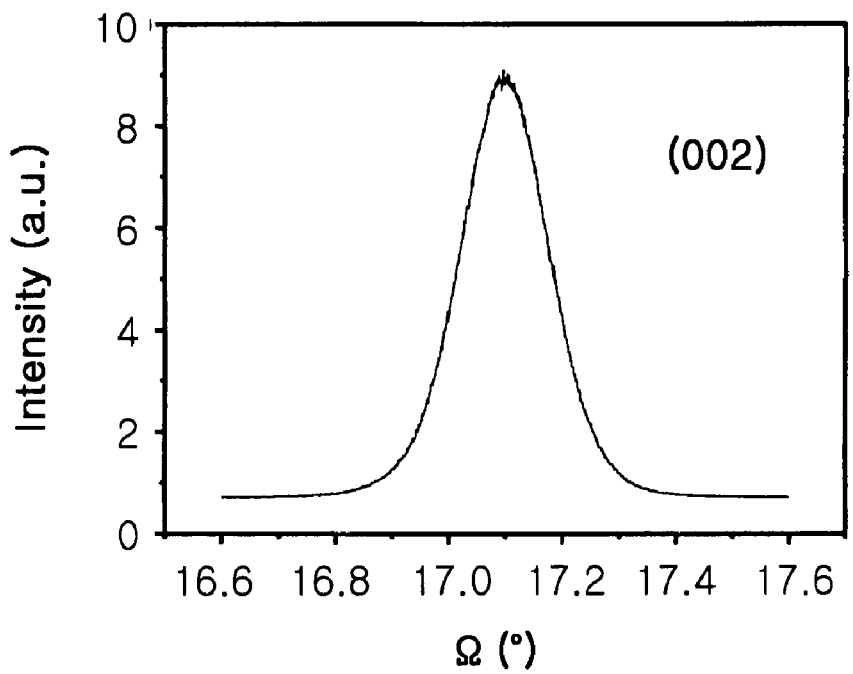
FIGS. 7(a) and (b) are graphs illustrating an XRD analysis result for (002) and (102) crystal orientations of the GaN layer obtained according to one embodiment of the invention.
Figure 7B:
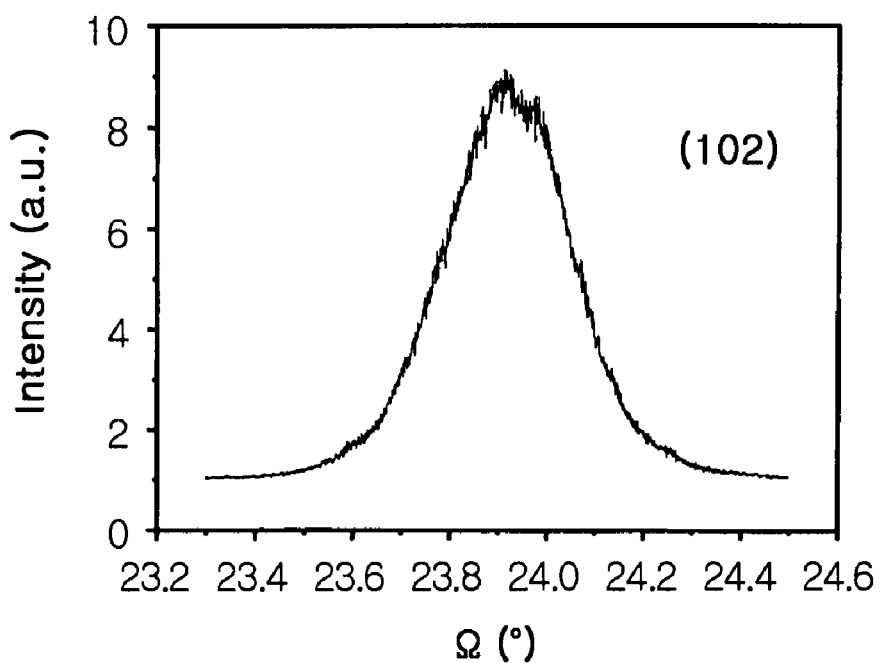

To confirm crystallinity of the GaN layer obtained in the embodiment, an XRD analysis was performed for (002) and (102) crystal planes, and the results are shown in FIGS. 7(a) and (b).

The XRD analysis results demonstrate a peak value of 17.1° and 23.9° in the (002) and (102) crystal planes, respectively, confirming growth of a normal GaN single crystal. In addition, for each plane, full width at half maximum (FWHM) indicative of crystalline quality was measured, and the FWHM was about 651.6 arcsec for the (002) plane and about 1112.4 arcsecit for the (102) plane. Therefore, the GaN single crystal grown according to the invention exhibited a higher quality than that grown on a conventional silicon substrate.

As set forth above, according to the invention, an amorphous oxide film such as $Al_2O_3$ is disposed between nitride buffer layers on a silicon substrate. This decreases dislocation density of the buffer layers, thereby allowing growth of a higher-quality nitride single crystal. Therefore, to manufacture a nitride semiconductor light emitting device according to the invention, an expensive sapphire substrate or SiC substrate can be substituted by a silicon substrate as a substrate for growing the nitride single crystal.

While the present invention has been shown and described in connection with the preferred embodiments, it will be apparent to those skilled in the art that modifications and variations can be made without departing from the spirit and scope of the invention as defined by the appended claims.

What is claimed is:

1. A method for growing a nitride single crystal comprising steps of:
    preparing a silicon substrate having a surface in (111) crystal orientation;
    forming a first nitride buffer layer on the surface of the silicon substrate;
    forming an amorphous oxide film on the first nitride buffer layer;
    forming a second nitride buffer layer on the amorphous oxide film; and
    forming the nitride single crystal on the second nitride buffer layer,
    wherein the amorphous oxide film is an $Al_2O_3$ amorphous film and the first buffer layer comprises AlN.

2. The method according to claim 1, wherein the amorphous oxide film has a thickness of about 5 nm to 30 nm.

3. The method according to claim 1, wherein the second nitride buffer layer has a composition expressed by $Al_xIn_yGa_{(1-x-y)}N$, where $0 \leq x \leq 1$, $0 \leq y \leq 1$ and $0 \leq x+y \leq 1$.

4. The method according to claim 1, wherein the second buffer layers comprises AlN.

5. The method according to claim 1, wherein the first and second nitride buffer layers have an identical composition.

6. The method according to claim 1, wherein the first nitride buffer layer has a thickness of at least 10 nm.

7. The method according to claim 1, wherein the second nitride buffer layer has a thickness of about 30 nm to 200 nm.

8. The method according to claim 1, wherein the nitride single crystal forming step is carried out via HVPE.

9. A nitride semiconductor light emitting device comprising:
    a silicon substrate having a surface in (111) crystal orientation;
    a first nitride buffer layer formed on the surface of the silicon substrate;
    an amorphous oxide film formed on the first nitride buffer layer;
    a second nitride buffer layer formed on the amorphous oxide film;
    a first conductivity-type nitride semiconductor layer formed on the second nitride buffer layer;
    an active layer formed on the first conductivity-type nitride semiconductor layer; and
    a second conductivity-type nitride semiconductor layer formed on the active layer,
    wherein the amorphous oxide film is an $Al_2O_3$ amorphous film and the first buffer layer comprises AlN.

10. The nitride semiconductor light emitting device according to claim 9, wherein the amorphous oxide film is patterned such that the first buffer layer directly contacts the second nitride buffer layer in a partial area of the amorphous oxide film.

11. The nitride semiconductor light emitting device according to claim 9, wherein the amorphous oxide film has a thickness of about 5 nm to 30 nm.

12. The nitride semiconductor light emitting device according to claim 9, wherein the second nitride buffer layers has a composition expressed by $Al_xIn_yGa_{(1-x-y)}N$, where $0 \leq x \leq 1$, $0 \leq y \leq 1$ and $0 \leq x+y \leq 1$.

13. The nitride semiconductor light emitting device according to claim 9, wherein the second nitride buffer layers comprises AlN.

14. The nitride semiconductor light emitting device according to claim 9, wherein the first nitride buffer layer has a thickness of at least 10 nm.

15. The nitride semiconductor light emitting device according to claim 9, wherein the second nitride buffer layer has a thickness of about 30 nm to 200 nm.

16. A method for manufacturing a nitride semiconductor light emitting device comprising steps of:

preparing a silicon substrate having a surface in (111) crystal orientation;

forming a first nitride buffer layer on the surface of the silicon substrate;

forming an amorphous oxide film on the first nitride buffer layer;

forming a second nitride buffer layer on the amorphous oxide film;

forming a first conductivity-type nitride semiconductor layer on the second nitride buffer layer;

forming an active layer on the first conductivity-type nitride semiconductor layer; and forming a second conductivity-type nitride semiconductor layer on the active layers, wherein the amorphous oxide film is an $Al_2O_3$ amorphous film and the first buffer layer comprises AlN.

17. The method according to claim 16, wherein the amorphous oxide film is patterned such that the first buffer layer directly contacts the second buffer layer in a partial area of the amorphous oxide film.

18. The method according to claim 16, wherein the amorphous oxide film has a thickness of about 5 nm to 30 nm.

19. The method according to claim 16, wherein the first nitride buffer layer has a thickness of at least 10 nm.

20. The method according to claim 16, wherein the second nitride buffer layer has a thickness of about 30 nm to 200 nm.

* * * * *